US006861199B2

United States Patent
Lee

(10) Patent No.: US 6,861,199 B2
(45) Date of Patent: Mar. 1, 2005

(54) PHOTORESIST COMPOSITION

(75) Inventor: Geun Su Lee, Busan (KR)

(73) Assignee: Hynix Semiconductor, Gyunggi-Do (KR)

(*) Notice: Subject to any disclaimer, the term of this patent is extended or adjusted under 35 U.S.C. 154(b) by 0 days.

(21) Appl. No.: 10/609,509

(22) Filed: Jun. 30, 2003

(65) Prior Publication Data
US 2004/0131965 A1 Jul. 8, 2004

(30) Foreign Application Priority Data
Dec. 14, 2002 (KR) .................. 10-2002-0079926

(51) Int. Cl.$^7$ .............................................. G03F 7/004
(52) U.S. Cl. .................. 430/270.1; 430/311; 430/319; 430/326; 430/328; 430/330; 430/907; 430/914
(58) Field of Search .................. 430/270.1, 311, 430/319, 326, 328, 330, 907, 914

(56) References Cited

U.S. PATENT DOCUMENTS

| 2,594,455 A | * | 4/1952 | Kosolapoff ................ 558/117 |
| 3,694,526 A | * | 9/1972 | Siddall et al. ............... 558/217 |
| 3,882,203 A | * | 5/1975 | Dulog et al. ................ 558/151 |
| 4,195,997 A | * | 4/1980 | Graham .................... 430/286.1 |
| 4,224,203 A | * | 9/1980 | Minagawa et al. ......... 524/123 |
| 4,601,969 A | * | 7/1986 | Clecak et al. ............... 430/192 |
| 4,935,332 A | * | 6/1990 | Lauke et al. ............. 430/272.1 |
| 5,256,808 A | * | 10/1993 | Alexandratos ............... 558/142 |
| 5,442,085 A | * | 8/1995 | Alexandratos ............... 558/142 |
| 5,684,116 A | * | 11/1997 | Martl et al. ................. 528/176 |
| 5,712,347 A | * | 1/1998 | Trochimcznk et al. ...... 525/340 |
| 6,048,995 A | * | 4/2000 | Grinter et al. ................ 558/87 |
| 6,579,658 B2 | * | 6/2003 | Hatakeyama et al. .... 430/270.1 |

* cited by examiner

Primary Examiner—Amanda Walke
(74) Attorney, Agent, or Firm—Marshall, Gerstein & Borun LLP

(57) ABSTRACT

TIMD (tetraisopropyl methylene diphosphonate) as a light absorbance depressant to a light source of a wavelength of less than 200 nm, and a photoresist composition containing the same are disclosed. The disclosed chemically amplified photoresist composition containing TIMD is useful for a VUV (vacuum ultraviolet) photoresist composition due to its low light absorbance to a light source of a wavelength of 157 nm.

18 Claims, 2 Drawing Sheets

PHOTORESIST COMPOSITION

BACKGROUND OF THE INVENTION

1. Technical Field

A photoresist composition having a low light absorbance to a light source of a wavelength of less than 200 nm is disclosed. More specifically, a VUV (vacuum ultraviolet) photoresist composition comprising TIMD (tetraisopropyl methylene diphosphonate) is disclosed that lowers a light absorbance to a light source of a wavelength of 157 nm.

2. Description of the Related Art

A photoresist composition used for a VUV photoresist film needs to have a low light absorbance at a wavelength of 157 nm, an excellent etching resistance, an ability to be adhesively attached to a wafer, and an ability to be developed with standard 2.38 wt % or 2.6 wt % aqueous TMAH (tetramethylammonium hydroxide) solutions.

Recently, much research has been conducted on resins having a high transparency at a wavelength of 193 nm and the same etching resistance as that of novolack resin which is a photoresist resin for KrF. However, since most of these photoresist resins show a high light absorbance at a wavelength of 157 nm, these photoresist resins are not suitable for a VUV photoresist film.

In order to overcome the above-described problem, research on a photoresist resin containing fluorine and silicon has been conducted. Unfortunately, polyethylene or polyacrylate resins containing fluorine have weak etching resistance, low solubility in the TMAH aqueous solution which results in degradation in development of the photoresist film, and poor adhesive property to a silicon substrate. Additionally, the compounds containing fluorine are gaseous at room temperature due to their low boiling point, and they should be handled with care because of their strong toxicity.

On the other hand, photoresist resins containing silicon have an etching process which is required to have the two-step treatment with hydrofluoric acid-oxygen. It is therefore difficult to completely remove fluorine after the treatment process.

In addition, photoresist resins containing silicon have an outgassing phenomenon where gas is generated in an exposure process, thereby damaging lens of a scanner or a stepper. In other words, silicon gasified by the exposure reacts with air to be transformed into SiO2. When the SiO2 is deposited on lens, a method for removing the SiO2 has not been suggested yet, and expensive lens of the scanner or the stepper must be replaced frequently.

Although polyethylene or polyacrylate resins containing fluorine having excellent solubility to developing solution may be used for VUV photoresist films, these resins still have poor etching resistance and adhesive property to a substrate, and high light absorbance.

SUMMARY OF THE DISCLOSURE

Accordingly, a light absorption depressant which lowers a light absorbance of photoresist at a wavelength of less than 200 nm, and a photoresist composition containing the same are disclosed.

DETAILED DESCRIPTION OF THE PRESENTLY PREFERRED EMBODIMENTS

TIMD (tetraisopropyl methylene diphosphonate) as a light absorption depressant, and a photoresist composition containing the same are disclosed.

There is provided TIMD compound represented by Formula 1 which lowers light absorbance to a light source of a wavelength of less than 200 nm.

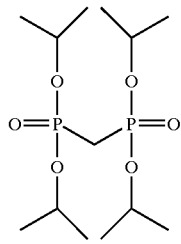

Formula 1

There is also provided a photoresist composition comprising the TIMD compound.

Preferably, the TIMD is present in an amount ranging from 0.01 to 25 wt %, more preferably ranging from 0.01 to 20 wt % based on a base resin included in the photoresist composition.

Although the photoresist composition is more useful in a photolithography process of a wavelength of 157 nm, it is also useful in a photolithography process of a wavelength of less than 200 nm such as 193 nm.

An employable base resin in this disclosure is not specifically limited. Referring to the following Examples 1 and 2, it is understood that desirable results are obtained when the disclosed light absorption depressant is added in the photoresist composition comprising different materials as base resin such as (1) a poly(norbornene hexafluoroalcohol) represented by Formula 2 or (2) a blend polymer of polymers represented by Formula 3a and Formula 3b.

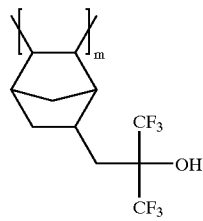

Formula 2

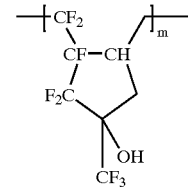

Formula 3a

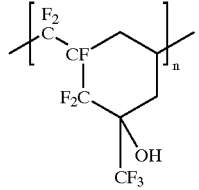

Formula 3b

It is preferable that the photoresist composition containing the disclosed light absorption depressant is a chemically amplified photoresist composition containing a photoacid generator. As the photoacid generator, any compound that can generate acid when exposed to light can be employed.

A process for forming a photoresist pattern comprises:

(a) coating a photoresist composition described above on an underlying layer to form a photoresist film;

(b) baking the photoresist film, and then exposing the baked photoresist film to light;

(c) baking the exposed photoresist film; and (d) developing the baked photoresist film to obtain a photoresist pattern.

There is also provided a semiconductor device manufactured according to the above-described process.

In addition, a photoresist composition comprising a hydrocarbon compound including a P=O group is disclosed.

The disclosed photoresist composition will be described in more details by referring to examples below, which are not intended to be limiting.

EXAMPLE 1

Variation of Light Absorbance Depending on the Added Amount of TIMD (1)

Poly(norbornenehexafluoroalcohol) of the above Formula 2 which is photoresist polymer for 157 nm was mixed with TIMD as an additive in an amount ranging from 0 to 20 wt %. Then, the resultant was coated on a substrate at a thickness of 2000 Å to form a thin photoresist film.

Figure 1:
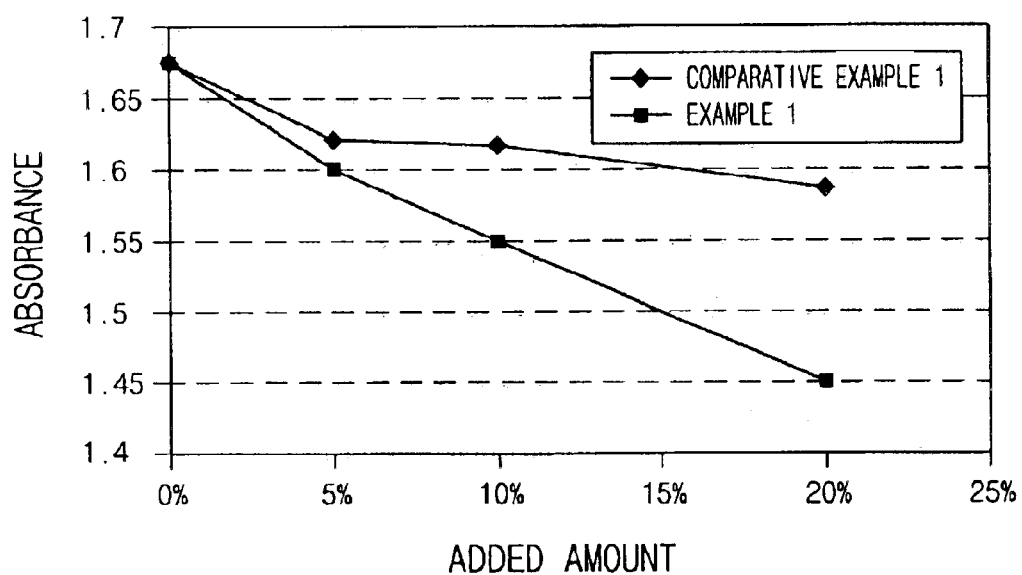
FIG. 1 is a graph illustrating the experimental results of Example 1 and Comparative Example 1.

Next, the light absorbance of the thin film measured using an ellipsometer of Sematech was shown in Table 1 and FIG. 1. The light absorbance was obtained by calculating light absorbance to the thin film having a thickness of 2000 Å in terms of a value to the thickness of 1 $\mu$m. The value of $\alpha 10$ to a light source of 157.6 nm was shown in FIG. 1.

TABLE 1

| Amount of added TIMD (%) | n (157.6 nm) | k (157.6 nm) | $\alpha(\mu m^{-1})$ (157.6 nm) | $\alpha_{10}$ (157.6 nm) | $\alpha(\mu m^{-1})$ (193 nm) | $\alpha_{10}$ (193 nm) |
|---|---|---|---|---|---|---|
| 0 | 1.667 | 0.049 | 3.87 | 1.68 | 0.25 | 0.107 |
| 5 | 1.667 | 0.046 | 3.70 | 1.61 | — | — |
| 10 | 1.687 | 0.045 | 3.56 | 1.55 | 0.19 | 0.085 |
| 20 | 1.702 | 0.042 | 3.35 | 1.45 | 0.10 | 0.044 | n: refraction index
k: light absorption coefficient
$\alpha(\mu m^{-1})$: light absorbance of material when light of a predetermined wavelength is penetrated into the material at a thickness of 1 $\mu$m
$\alpha_{10} \times 2.3 = \alpha(\mu m^{-1})$

EXAMPLE 2

Variation of Light Absorbance Depending on the Amount of Added TIMD (2)

The blend polymer of Formula 3a and 3b which is photoresist polymer for 157 nm were mixed with TIMD as an additive in an amount ranging from 0 to 20 wt %. Then, the resultant was coated on a substrate at a thickness of 2000 Å to form a thin photoresist film.

Figure 2:
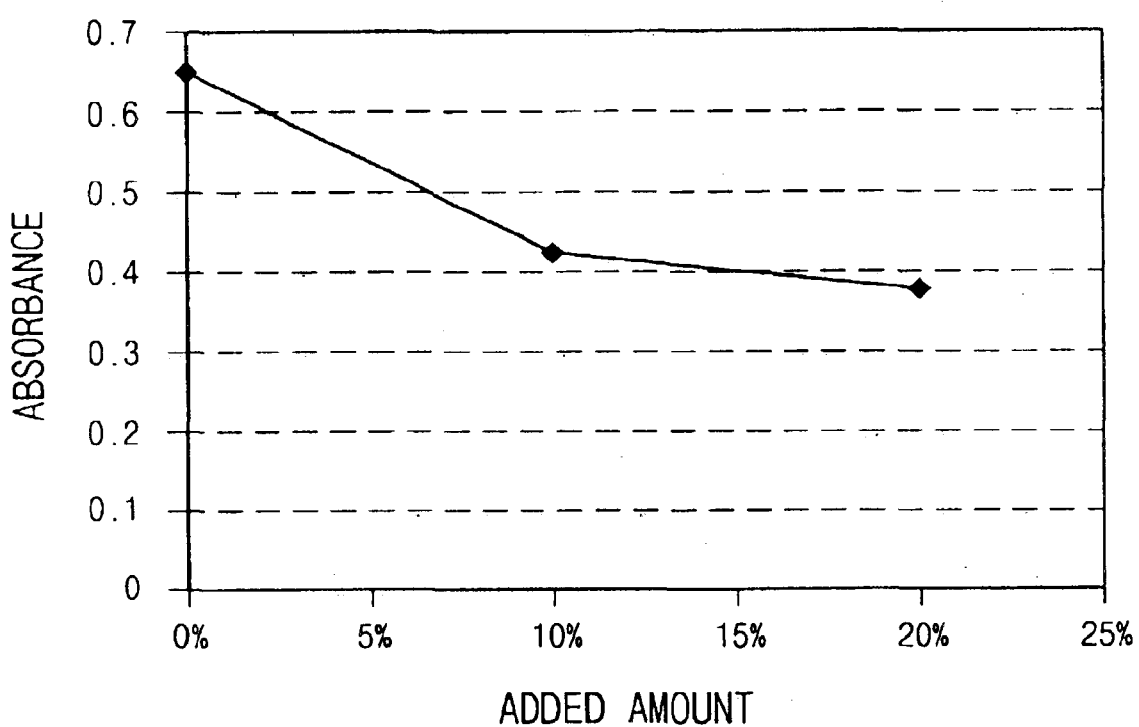
FIG. 2 is a graph illustrating the experimental result of Example 2.

Next, the light absorbance of the thin film measured using an ellipsometer of Sematech was shown in Table 2 and FIG. 2. The light absorbance was obtained by calculating light absorbance to the thin film having a thickness of 2000 Å in terms of a value to the thickness of 1 $\mu$m. The value of $\alpha 10$ to a light source of 157.6 nm was shown in FIG. 2.

TABLE 2

| Amount of added TIMD (%) | n (157.6 nm) | k (157.6 nm) | $\alpha(\mu m^{-1})$ (157.6 nm) | $\alpha_{10}$ (157.6 nm) | $\alpha(\mu m^{-1})$ (193 nm) | $\alpha_{10}$ (193 nm) |
|---|---|---|---|---|---|---|
| 0 | 1.553 | 0.019 | 1.52 | 0.66 | 0.32 | 0.139 |
| 5 | 1.580 | 0.012 | 0.99 | 0.43 | — | — |
| 10 | 1.573 | 0.013 | 0.99 | 0.43 | 0.23 | 0.098 |
| 15 | 1.591 | 0.011 | 0.88 | 0.38 | — | — |
| 20 | 1.612 | 0.011 | 0.88 | 0.38 | 0.12 | 0.053 | n: refraction index
k: light absorption coefficient
$\alpha(\mu m^{-1})$: light absorbance of material when light of a predetermined wavelength is penetrated into the material at a thickness of 1 $\mu$m
$\alpha_{10} \times 2.3 = \alpha(\mu m^{-1})$

COMPARATIVE EXAMPLE 1

Variation of Light Absorbance in Other Additives

The procedure of Example 1 was repeated using 2-methyl-hexfluoro isopropoxy ethoxy methane represented by Formula 4 instead of the TIMD as an additive. The experimental result was shown in Table 3 and FIG. 1. The value of $\alpha 10$ to a light source of 157.6 nm was shown in FIG. 3.

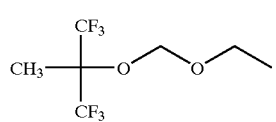

Formula 4

TABLE 3

| Amount of added additive (%) | n (157.6 nm) | k (157.6 nm) | α(μm⁻¹) (157.6 nm) | α₁₀ (157.6 nm) |
|---|---|---|---|---|
| 0 | 1.668 | 0.049 | 3.87 | 1.68 |
| 5 | 1.665 | 0.047 | 3.74 | 1.62 |
| 10 | 1.666 | 0.047 | 3.74 | 1.63 |
| 20 | 1.666 | 0.046 | 3.66 | 1.59 | n: refraction index
k: light absorption coefficient
α(μm⁻¹): light absorbance of material when light of a predetermined wavelength is penetrated into the material at a thickness of 1 μm
$\alpha_{10} \times 2.3 = \alpha(\mu m - 1)$ As shown in Examples 1 and 2 and the Comparative Example, the disclosed TIMD more remarkably reduces the light absorbance (α10) than the same amount of the compound of Formula 4 which has been conventionally used to lower light absorbance of a photoresist polymer. When different kinds of photoresist polymers are individually used, the light absorbance of each polymer is also shown to be reduced. Additionally, since the light absorbance is reduced in a wavelength of 193 nm as well as of 157 nm, the disclosed TIMD is useful in a photolithography process using an ArF(193 nm) as well as a VUV(157 nm).

Meanwhile, it is presumed that a P=O group included in the TIMD compound may remarkable reduce the light absorbance. The similar effect may be obtained when a compound including a P=O group is added in a photoresist composition instead of the TIMD compound. In addition, the light absorbance of photoresist may be reduced when a predetermined amount of a P=O group is included in a photoresist composition, regardless of the position of the P=O group. For example, the light absorbance of photoresist may be lowered if a P=O group is introduced into a base resin of a photoresist composition or included in a dissolution inhibitor.

As discussed earlier, light absorbances of photoresist materials to light sources of 157 nm and 193 nm are remarkably reduced when a TIMD compound is added as an additive in a conventional chemically amplified photoresist composition. Instead of the TIMD compound, a compound including a P=O group may have the similar effect to the TIMD. Accordingly, it is expected that the light absorbance of photoresist may be also reduced by introducing a P=O group into a base resin.

What is claimed is:

1. A light absorption depressant comprising:
a TIMD (tetraisopropyl methylene diphosphonate) which depresses light absorption at a wavelength of less than 200 nm.

2. The light absorption depressant according to claim 1, wherein the wavelength is 157 nm or 193 nm.

3. A photoresist composition comprising a TIMD (tetraisopropyl methylene diphosphonate).

4. The photoresist composition according to claim 3 further comprising a base resin and wherein the TIMD is present in an amount ranging from 0.01 to 25 wt % based on the base resin.

5. The photoresist composition according to claim 4, wherein the TIMD is present in an amount ranging from 0.01 to 20 wt % based on the base resin.

6. The photoresist composition according to claim 3, wherein the TIMD is added in the photoresist composition for a 157 nm light source or for a 193 nm light source.

7. The photoresist composition according to claim 3, which comprises (1) a poly(norbornenehexafluoroalcohol) represented by Formula 2 or (2) a blend polymer of polymers represented by Formula 3a and Formula 3b as a base resin.

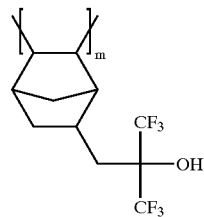

Formula 2

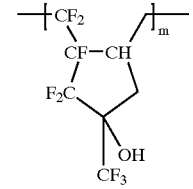

Formula 3a

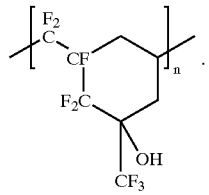

Formula 3b

8. The photoresist composition according to claim 7, wherein the composition is a chemically amplified photoresist composition comprising a photoacid generator.

9. A process for forming a photoresist pattern, comprising:
(a) coating the photoresist composition of claim 3 on an underlying layer to form a photoresist film;
(b) baking the photoresist film, and then exposing the baked photoresist film to light;
(c) baking the exposed photoresist film; and
(d) developing the baked photoresist film to obtain a photoresist pattern.

10. A semiconductor device manufactured according to the process of claim 9.

11. A photoresist composition comprising a TIMD (tetraisopropyl methylene diphosphonate) and a base resin selected from the group consisting of

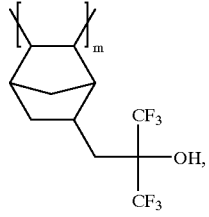

Formula 2

-continued

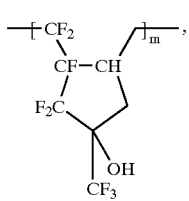

Formula 3a

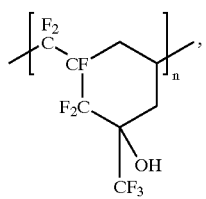

Formula 3b and mixtures thereof.

12. The photoresist composition according to claim 11, wherein the TIMD is present in an amount ranging from 0.01 to 25 wt % based on the base resin.

13. The photoresist composition according to claim 12, wherein the TIMD is present in an amount ranging from 0.01 to 20 wt % based on the base resin.

14. The photoresist composition according to claim 11, wherein the TIMD is added in the photoresist composition for a 157 nm light source or for a 193 nm light source.

15. The photoresist composition according to claim 14, wherein the composition is a chemically amplified photoresist composition comprising a photoacid generator.

16. A process for forming a photoresist pattern, comprising:
   (a) coating the photoresist composition of claim 11 on an underlying layer to form a photoresist film;
   (b) baking the photoresist film, and then exposing the baked photoresist film to light;
   (c) baking the exposed photoresist film; and
   (d) developing the baked photoresist film to obtain a photoresist pattern.

17. The photoresist composition according to claim 11 further comprising a hydrocarbon compound including P=O groups.

18. A semiconductor device manufactured according to the process of claim 16.

* * * * *